(12) United States Patent
Okubo

(10) Patent No.: US 6,429,635 B2
(45) Date of Patent: Aug. 6, 2002

(54) DRIVE CIRCUIT FOR INSULATED GATE TYPE FETS

(75) Inventor: Toshiro Okubo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/801,412

(22) Filed: Mar. 8, 2001

(30) Foreign Application Priority Data

Mar. 10, 2000 (JP) .......................................... 2000-66853
Feb. 20, 2001 (JP) .......................................... 2001-43422

(51) Int. Cl.[7] .............................. G05F 1/40; G05F 1/44; G05F 1/56
(52) U.S. Cl. ........................ 323/282; 323/271; 323/274
(58) Field of Search ................................. 323/271, 268, 323/282, 284, 273, 274

(56) References Cited

U.S. PATENT DOCUMENTS

| | | | | |
|---|---|---|---|---|
| 5,227,675 A | * | 7/1993 | Taguchi | 327/530 |
| 5,301,097 A | * | 4/1994 | McDaniel | 363/60 |
| 5,714,809 A | * | 2/1998 | Clemo | 307/125 |
| 5,758,102 A | * | 5/1998 | Carey et al. | 395/283 |
| 5,917,346 A | * | 6/1999 | Gord | 327/101 |
| 5,986,441 A | * | 11/1999 | Koroncai et al. | 323/277 |
| 6,060,869 A | * | 5/2000 | Shimoda | 323/271 |

* cited by examiner

Primary Examiner—Bao Vu
(74) Attorney, Agent, or Firm—Hogan & Hartson, L.L.P.

(57) ABSTRACT

A drive circuit for driving an FET includes a charge pump circuit which comprises multi-stage switching elements, condensers, and inversion buffers, and operates in response to the oscillatory output of an oscillator circuit; and a comparison means for comparing the output voltage of the charge pump circuit with a preset reference voltage to thereby control the oscillation of the oscillator circuit. The charge pump circuit is thus operated intermittently so as to provide a sufficiently large gate voltage to the MOSFET in a stable manner, thereby maintaining a constant output-load characteristic.

15 Claims, 3 Drawing Sheets

DRIVE CIRCUIT FOR INSULATED GATE TYPE FETS

FIELD OF THE INVENTION

The invention relates to a high efficiency drive circuit for driving an FET having an insulated gate (hereinafter referred to as insulated gate type FET) such as a Metal Insulator Semiconductor Field Effect Transistor (MISFET) and a Metal Oxide Semiconductor Field Effect Transistor (MOSFET) by impressing a boosted voltage on the gate of the FET.

BACKGROUND OF THE INVENTION

Insulated gate type MISFETs and MOSFETs are widely used as switching elements in controlling disk devices such as CDs, MDs and DVD-ROMs. The resistance of a MOSFET, for example, when it is turned on (hereinafter referred to as ON resistance) greatly affects the power conversion efficiency of an appliance which uses the FET. Therefore, in order to impress a higher voltage on the gate of a MOSFET than that of a power supply so as to lower the ON-resistance of the MOSFET and maintain a high power conversion efficiency thereof, a charge pump circuit is used as a power supply to drive the gate.

FIG. 1 illustrates a conventional MOSFET drive circuit, which boosts up the source voltage Vcc of a power supply 10 by means of a double charge pump circuit 20, and supplies the boosted voltage to an n-type load MOSFET Qm via a gate control circuit 30. The MOSFET drive circuit is incorporated in a semiconductor integrated circuit (IC).

The double charge pump circuit 20 includes a p-type MOSFET Q1, a p-type MOSFET Q2, inversion buffer circuits B1–B3, condensers C1 and C2, and an oscillator circuit OSC.

The double charge pump circuit 20 boosts up the source voltage Vcc by first turning on the MOSFET Q1 and turning off the MOSFET Q2 when the output level of the oscillator circuit OSC is high and the output level of an inversion buffer circuit B1 is low and the output level of an inversion buffer circuit B2 is high. The output of the inversion buffer circuit B3 is then at L level. Hence, the condenser C1 is charged towards Vcc.

When the output of the oscillator circuit OSC is low, the output of the inversion buffer circuit B1 is high, so that the MOSFET Q1 is turned off, and the output of the inversion buffer circuit B2 is low, so that the MOSFET Q2 is turned on. The output level of the inversion buffer circuit B3 is then high. As a result, the condenser C2 is impressed with the voltage of the condenser C1 plus the high output voltage of the inversion buffer circuit B3 (which equals the Vcc), so that the condenser C2 is charged towards 2Vcc.

Such charging process is repeated at every inversion of the output of the oscillator circuit OSC from H to L level and from L to H level, bringing the charged voltage of the condenser C2 to 2Vcc. This voltage is supplied to the gate of the load MOSFET Qm via the gate control circuit 30. The voltage of 2Vcc is presumably large enough to drive the load MOSFET Qm, so that the load MOSFET Qm has a very small resistance as it is fully turned on by the voltage.

The prior art MOSFET drive circuit as shown in FIG. 1 has a comparatively simple structure to provide a necessary boosted voltage. The external condensers C1 and C2 for the IC are not costly.

The gate circuit of the MOSFET is electrically insulated from the drain and the source of the MOSFET by an insulating oxide film, so that in principle the gate does not require any electric power, so long as it is provided with a predetermined electric potential, and hence it has been believed that it requires only a simple drive circuit as shown in FIG. 1.

In actuality, however, a current flows through the gate charging the floating capacity thereof every time the load MOSFET Qm is switched. Consequently, when the area of the gate is increased to lower the ON-resistance, or when the switching frequency of the load MOSFET Qm such as a PWM driver for example, energy consumption due to the switching becomes large and lowers the output voltage of the MOSFET drive circuit. That is, the circuit becomes unable to provide a required gate voltage.

Under the lowered output voltage, the load MOSFET Qm cannot be fully turned on and exhibits a non-negligible resistance, if the load MOSFET Qm maintains its switching operation. Consequently, the power conversion efficiency of the appliance having the load MOSFET Qm is degraded.

A chopper type power supply is also known to serve as an alternative voltage booster. A chopper type power supply can maintain its output voltage at a constant level, and has a superb constant output-load characteristic. It normally requires a costly coil and a Shottkey diode as external control elements therefor.

In short, it has been difficult to provide a cost effective high-efficient drive circuit due to the fact that conventional MOSFET drive circuits utilizing a charge pump circuit are cost-effective but have a poor output-load characteristic for a MOSFET Qm and that a MOSFET drive circuit utilizing a chopper booster circuit has a good output-load characteristic but requires expensive external elements.

SUMMARY OF THE INVENTION

In accordance with one aspect of the present invention, a drive circuit for driving an insulated gate type FET (hereinafter referred to as insulated get FET drive circuit) comprises: an oscillator circuit providing an oscillatory output; a charge pump circuit for boosting up a voltage input thereto in response to the oscillatory output of the oscillator circuit; and comparison means for comparing the output voltage of the charge pump circuit with a preset reference voltage and for outputting the result of the comparison; wherein the charge pump circuit includes: at least one charge pump unit, concatenated if more than one charge pump unit exist, each charge pump unit having a switch turned on/off by the oscillatory output of the oscillator circuit and a condenser connected between the switch and the oscillator circuit; and a charge pump unit in the output stage of the drive circuit having a switch turned on/off by the oscillatory output of the oscillator circuit and a condenser connected between the switch and a source of predetermined electrical potential; and wherein the charge pump unit in the output stage of the drive circuit is further concatenated with the at least one charge pump unit; wherein the charge pump circuit supplies the output voltage thereof to the gate of the FET; and wherein the comparison means controls stopping/starting of the oscillation of the oscillator circuit in accordance with the comparison.

Thus, the charge pump circuit of the invention can provide a sufficiently large voltage as required to the gate of the insulated gate FET in a stable manner by operating the oscillator circuit such that the charge pump circuit is intermittently operated, i.e., the charge pump circuit is stopped and started intermittently. Accordingly, the drive circuit can maintain the ON-resistance of the insulated gate FET at L level, thereby maintaining a high power conversion efficiency of the FET. In this arrangement of the charge pump circuit, integration of the elements of the circuit on an integrated circuit board is easy. Condensers may be fabricated at low cost if they are provided as external elements.

It should be noted that the comparison means may have a voltage divider for generating a divided voltage from the output voltage and a comparator for comparing the divided voltage with the preset reference voltage. Thus, the output voltage may be set to a desired level by changing the division ratio of the voltage divider.

In addition, the phase of the output voltage of the oscillator may be chosen such that the switch of the charge pump unit in the output stage is turned off when the oscillator circuit is stopped, so that the condenser of the charge pump unit in the output stage is quickly charged when the oscillation is resumed subsequently.

Also, the switch of the drive circuit may be a P-channel MOSFET and the gate of the switch is driven by the output of an inversion buffer circuit. Furthermore, the charge pump circuit along with the charge pump unit in the output stage may include three charge pump units.

In accordance with another aspect of the present invention, the comparison means may be a comparator coupled to the oscillator circuit.

Also, in accordance with a further aspect of the present invention, a method for providing power to an insulated gate FET comprises the steps of: providing an oscillatory output; generating an output voltage by boosting up an input voltage in response to the oscillatory output; supplying the output voltage to the gate of the FET; comparing the output voltage with a preset reference voltage; and controlling the stopping/starting of the oscillatory output in accordance with the comparison of the output voltage with the preset reference voltage. The method also may include the following steps of generating a divided voltage from the output voltage, comparing the divided voltage to the preset reference voltage, and controlling the stopping/starting of the oscillatory output in accordance with the comparison of the divided voltage with the preset reference voltage.

BRIEF DESCRIPTION OF THE DRAWINGS

The invention will now be described by way of example with reference to accompanying drawings, in which like reference numerals indicate like parts and in which.

DETAILED DESCRIPTION OF THE PREFERRED EMBODIMENT

Figure 2:
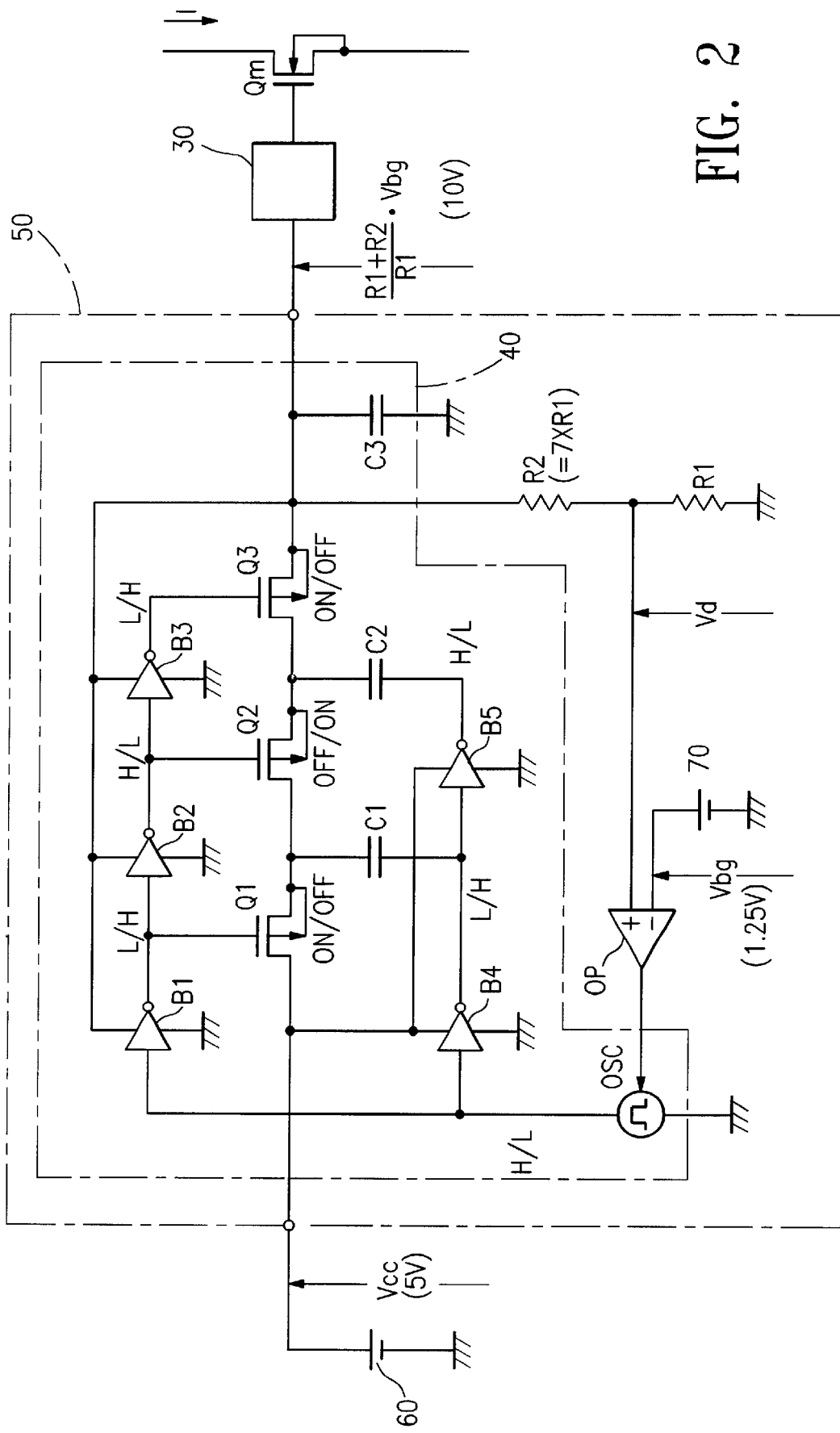
FIG. 2 is a circuit diagram of a MOSFET drive circuit according to the invention.

Referring now to FIG. 2, there is shown a triple charge pump circuit 40, which comprises: p type MOSFETs Q1, Q2, and Q3 connected in series between the input end and the output end of the circuit; series inversion buffer circuits B1, B2, and B3 for providing the respective gates of the MOSFETs Q1–Q3 with gate voltage, condensers C1, C2, and C3 each having one end connected with the corresponding output end of the MOSFETs Q1–Q3; inversion buffer circuits B4 and B5 connected in series, each providing a predetermined voltage to the other ends of the condensers C1 and C2, respectively; and an oscillator circuit OSC for providing predetermined high and low oscillatory output voltages to the series inversions buffer circuits B1–B3, and the inversion buffer circuits B4 and B5. The oscillator circuit OSC may be provided as separate parts outside the charger pump circuit 40. The condensers C1–C3 can be formed as independent elements to the charge pump circuit, or fabricated within the charge pump circuit along with other circuit elements.

In the triple charge pump circuit 40, the first charge pump unit (first stage charge pump unit) is formed of the MOSFET Q1, the condenser C1, the inversion buffer circuits B1 and B4; the second charge pump unit (second stage charge pump unit) is formed of the MOSFET Q2, the condenser C2, and the inversion buffer circuits B2 and B5; the charge pump unit in the output stage (output stage charge pump unit) is formed of the MOSFET Q3, the condenser C3, the inversion buffer circuit B3.

The charge pump circuit 50 adapted to operate intermittently (which circuit will be referred to as intermittent charge pump circuit) includes: the triple charge pump circuit 40, and resistors R1 and R2 for dividing the output voltage of the intermittent charge pump circuit 50 to derive a divided voltage Vd; and a comparator OP receiving the divided voltage Vd from the voltage divider and a reference voltage Vbg from a voltage source 70 to compare the two voltages and stop the oscillation of the oscillator circuit OSC when it is found in the comparison that the voltage Vd is higher than the reference voltage Vbg. The comparator OP may have a hysteresis so that the voltage required for stopping the oscillation differs from the voltage for resuming the oscillation.

The intermittent charge pump circuit 50 is provided with the supply voltage Vcc of a power supply 60 to generate a predetermined boosted voltage. The output voltage of the intermittent charge pump circuit 50 is provided to the gate of the load MOSFET Qm via a gate control circuit 30. The load MOSFET Qm can be any other type of insulated gate type FET including MISFETs.

In the embodiment shown herein, the frequency of the oscillator circuit OSC is set to 300 KHz, the supply voltage Vcc is 5 Volts, the output voltage to 10 Volts, the reference voltage Vbg to 1.25 Volts, and the resistance of the resistor R2 to R1×7. Then the rise time of the triple charge pump circuit 40 is approximately 200 microseconds.

The operation of the inventive drive circuit for use with a MOSFET will now be described below.

In operation, when the output level of the oscillator circuit OSC of the intermittent charge pump circuit 50 is high, the output level of the inversion buffer circuit B1 is low, thereby turning on the MOSFET Q1; the output level of the inversion buffer circuit B2 is high, thereby turning off the MOSFET Q2; and the output level of the inversion buffer circuit B3 is low, thereby turning on the MOSFET Q3. The output level of the inversion buffer circuit B4 is then low, and that of inversion buffer circuit B5 is high. Consequently, the condenser C1 is charged towards Vcc. It will be noted that the condenser C3 is charged to a voltage close to Vcc via parasitic diodes of the MOSFETs Q1–Q3 prior to the operation. The inversion buffer circuits B1–B3 will be driven by the charged voltage of the condenser C3 at the beginning of the operation.

Next, as the output level of the oscillator circuit OSC becomes low, the output level of the inversion buffer circuit B1 becomes high, thereby turning off the MOSFET Q1; the output level of the inversion buffer circuit B2 is low, thereby turning on the MOSFET Q2; and the output level of the inversion buffer circuit B3 is high, thereby turning off the MOSFET Q3. Under this condition, the output level of the inversion buffer circuit B4 is high, and that of the inversion buffer circuit B5 is low. As a result, the high output voltage of the inversion buffer circuit B4 is superposed to the charged voltage of condenser C1, so that the condenser C2 will be charged towards 2Vcc (where Vcc is the supply voltage).

Next, as the output level of the oscillator circuit OSC is again raised to high, the output level of the inversion buffer circuit B1 becomes low, thereby turning on the MOSFET Q1; the output level of the inversion buffer circuit B2 is high, thereby turning off the MOSFET Q2; and the output level of the inversion buffer circuit B3 is low, thereby turning on the MOSFET Q3. The output level of the inversion buffer circuit B4 is then low, and that of the inversion buffer circuit B5 is high. As a result, the condenser C1 is charged towards Vcc, and the condenser C3 will be charged towards 3Vcc, since the high output voltage of the inversion buffer circuit B5 will be superposed to the charged voltage of the condenser C2.

Such charging process is repeated for each inversion of the output signal of the oscillator circuit OSC from high to low, and vise versa, to thereby boost the charged voltage of the condenser C3 towards 3Vcc.

In the embodiment shown herein, the output voltage of the intermittent charge pump circuit 50 is divided by the resistors R1 and R2 to generate a divided voltage Vd, which is supplied to the non-inverting input end of the comparator OP. On the other hand, the inverting input end of the comparator OP is supplied with the reference voltage Vbg of the voltage source 70. As a consequence, if the voltage Vd is higher than the reference voltage Vbg, the comparator OP generates an output for stopping the oscillation of the oscillator circuit OSC, and hence the operation of the triple charge pump circuit 40. The output voltage of the triple charge pump circuit 40 is then Vbg×(R1+R2)/R1, which is above 10 Volts.

This output voltage of about 10 Volts is impressed on the gate of the load MOSFET Qm. The output voltage of 10 Volts is sufficient to drive the load MOSFET Qm, that is, the voltage is sufficient to fully turn on the load MOSFET Qm. Hence, the ON-resistance of the load MOSFET Qm is then sufficiently low. It is noted that by changing the ratio of R1 to R2, it is possible to obtain a desired output voltage.

Under the condition, as the charge on the condenser C3 is discharged while driving the load MOSFET Qm, the output voltage of the intermittent charge pump circuit 50 decreases. Since the output voltage of the comparator OP vanishes when the divided voltage Vd becomes lower than the reference voltage Vbg, the oscillator circuit OSC resumes its oscillation, thereby causing the triple charge pump circuit 40 to resume the pumping operation. Thus, the output voltage which has once lowered below 10 Volts begins to rise above 10 Volts. In this manner, the output voltage is maintained at substantially constant level of about 10 Volts.

Figure 1:
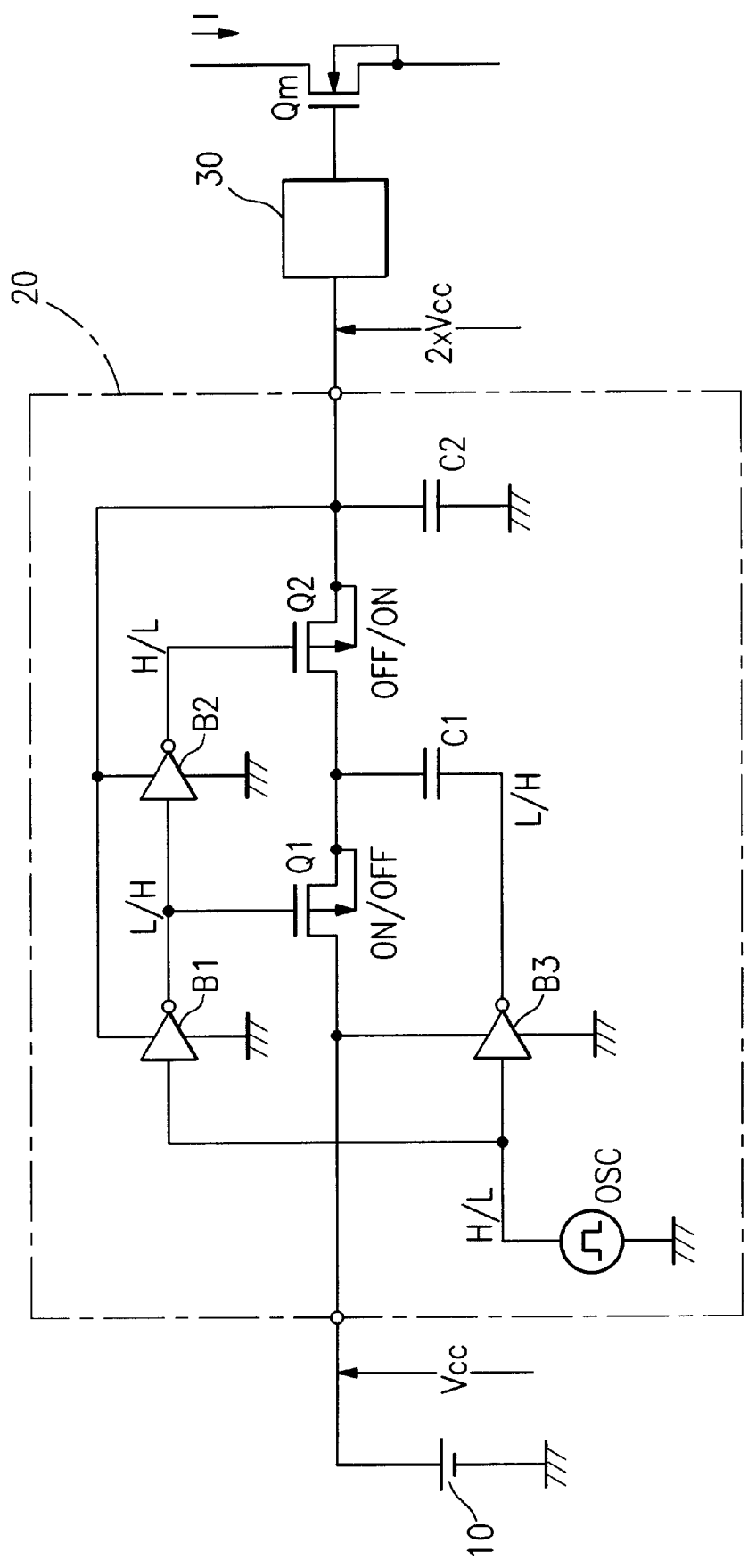
FIG. 1 is a circuit diagram of a conventional MOSFET drive circuit.
Figure 3:
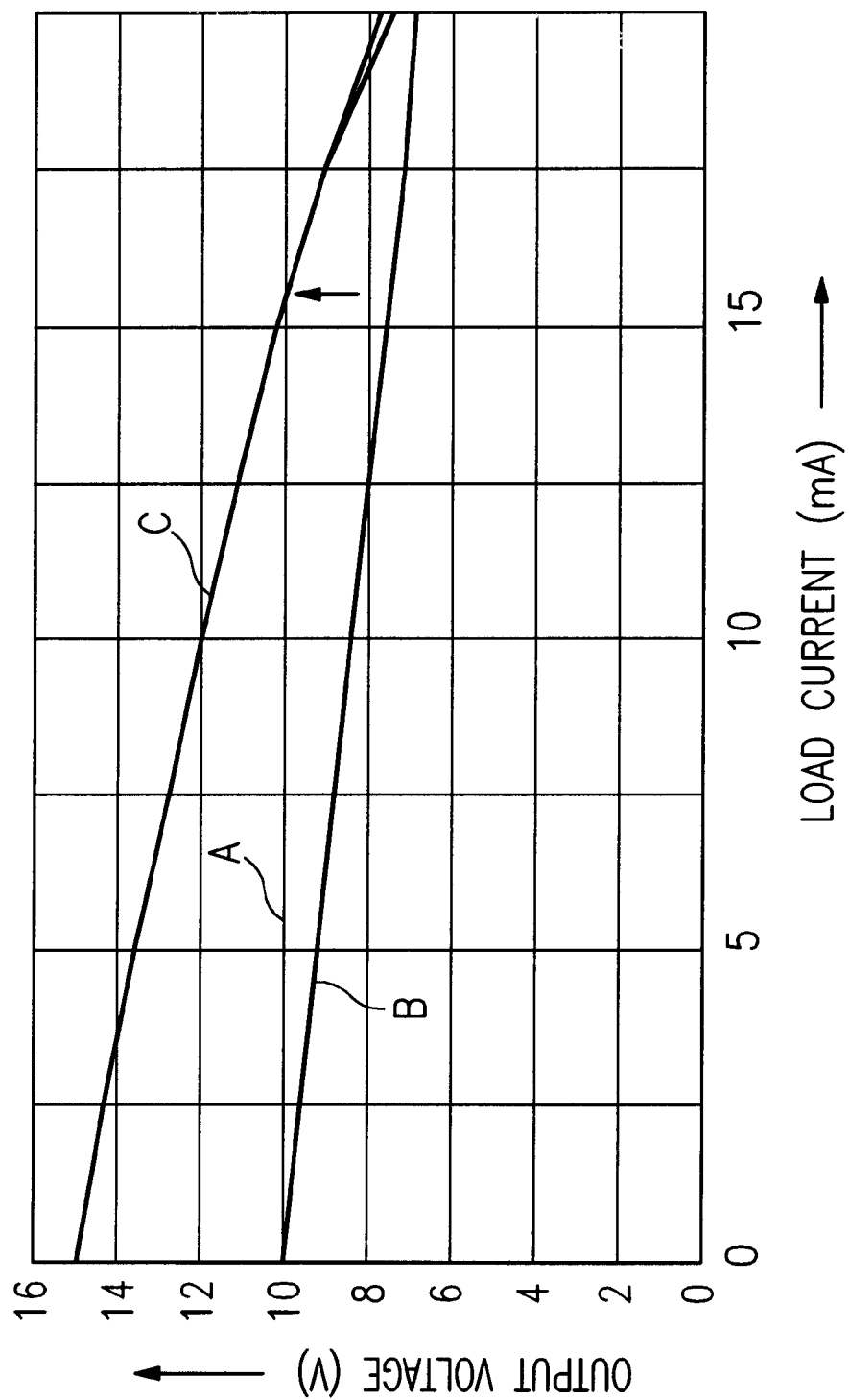
FIG. 3 is a graphical representation of output load characteristics of an inventive MOSFET, a conventional drive circuit, and a drive circuit to be compared with the inventive drive circuit.

A typical output-load characteristic of an embodiment of the invention is shown by a curve A in FIG. 3. This curve shows the output voltage V appearing at the output terminal of the intermittent charge pump circuit 50 as a function of load current supplied from the output terminal. The curve B shown in FIG. 1 shows the characteristic of a conventional circuit, and curve C shows that of a portional triple charge pump having an oscillator and triple charge pump units without any comparison means.

It is shown by curve A in FIG. 3 that the circuit of the invention successfully maintains a substantially constant output voltage of 10 Volts irrespective of the load current. This constant output voltage will be maintained until the current through the drive circuit reaches its maximum permissible current (as indicated by an arrow in the figure.)

In contrast, in the conventional circuit as shown by the curve B, the output voltage decreases with the load current, no matter how small the current is. It is seen from FIG. 3 that the characteristic curve C is similar in nature to the curve B, except that the curve C is relatively higher than the curve B.

Thus, it should be appreciated that the inventive charge pump circuit has a superb output-load characteristic as compared with the conventional charge pump circuit. It should be also appreciated that the output voltage may be set to an arbitrary desired level by appropriately setting the ratio of the divider resistors R1 and R2. Therefore, it is possible to provide any required gate voltage for the MOSFET and maintain the ON resistance of the MOSFET very small without being affected by the load.

In addition, in the inventive circuit, the phase of the oscillator circuit OSC may be set arbitrarily during an intermission of the charge pumping to prepare for the next oscillation. In the example shown in FIG. 2, the phase of the oscillator circuit OSC is set such the level of the oscillator circuit OSC when stopped is low so that the MOSFET Q3 is turned off, MOSFET Q2 is turned on, and the inversion buffer circuit B5 has L level.

When the oscillation is resumed, the output level of the oscillator circuit OSC is immediately raised to H level, so that the MOSFET Q3 is turned on, the MOSFET Q2 is turned off, bringing the output level of the inversion buffer circuit B5 to II level. An optimum choice of the phase of the oscillator circuit OSC in the manner as described above will make quickest charging of the condenser C3.

What we claim is:

1. A drive circuit for use with an insulated gate type FET, comprising:
    an oscillator circuit providing an oscillatory output;
    a charge pump circuit for boosting up a voltage input thereto in response to said oscillatory output of said oscillator circuit; and
    comparison means for comparing the output voltage of said charge pump circuit with a preset reference voltage and for outputting the result of the comparison;
    wherein said charge pump circuit includes:
        at least one charge pump unit, concatenated if more than one charge pump unit exist, each charge pump unit having
            a switch turned on/off by said oscillatory output of said oscillator circuit and
            a condenser connected between said switch and said oscillator circuit; and
        a charge pump unit in the output stage of the drive circuit having
            a switch turned on/off by said oscillatory output of said oscillator circuit and
            a condenser connected between said switch and a source of predetermined electrical potential; and
        wherein said charge pump unit in the output stage of the drive circuit is further concatenated with said at least one charge pump unit;
    wherein said charge pump circuit supplies said output voltage thereof to the gate of the FET; and
    wherein said comparison means controls stopping/starting of the oscillation of said oscillator circuit in accordance with the comparison.

2. The drive circuit according to claim 1, wherein said comparison means has a voltage divider for generating a divided voltage from said output voltage and a comparator for comparing said divided voltage with said preset reference voltage.

3. The drive circuit according to claim 1, wherein the phase of the output voltage of said oscillator is chosen such that said switch of said charge pump unit in said output stage is turned off when said oscillator circuit is stopped, so that said condenser of said charge pump unit in said output stage is quickly charged when said oscillation is resumed subsequently.

4. The drive circuit according to claim 1, wherein said switch is a P-channel MOSFET and the gate of said switch is driven by the output of an inversion buffer circuit.

5. The drive circuit according to claim 1, wherein said charge pump circuit with said charge pump unit in the output stage includes three charge pump units.

6. A driver circuit for use with an insulated gate type FET, comprising:
an oscillator circuit providing an oscillatory output;
a charge pump circuit for boosting up a voltage input thereto in response to said oscillatory output of said oscillator circuit; and
a comparator coupled to said oscillator circuit for comparing the output voltage of said charge pump circuit with a preset reference voltage and for outputting the result of the comparison;
wherein said charge pump circuit includes:
at least one charge pump unit, concatenated if more than one charge pump unit exist, each charge pump unit having
a switch turned on/off by said oscillatory output of said oscillator circuit and
a condenser connected between said switch and said oscillator circuit; and
a charge pump unit in the output stage of the drive circuit having
a switch turned on/off by said oscillatory output of said oscillator circuit and
a condenser connected between said switch and a source of predetermined electrical potential; and
wherein said charge pump unit in the output stage of the drive circuit is further concatenated with said at least one charge pump unit;
wherein said charge pump circuit supplies said output voltage thereof to the gate of the FET; and
wherein said comparator controls stopping/starting of the oscillation of said oscillator circuit.

7. The drive circuit according to claim 6, further comprising a voltage divider coupled to said comparator for generating a divided voltage from said output voltage.

8. The drive circuit according to claim 7, wherein the comparator compares said divided voltage with said preset reference voltage.

9. The drive circuit according to claim 6, wherein the phase of the output voltage of said oscillator is chosen such that said switch of said charge pump unit in said output stage is turned off when said oscillator circuit is stopped, so that said condenser of said charge pump unit in said output stage is quickly charged when said oscillation is resumed subsequently.

10. The drive circuit according to claim 6, wherein said switch is a P-channel MOSFET and the gate of said switch is driven by the output of an inversion buffer circuit.

11. The drive circuit according to claim 6, wherein said charge pump circuit with said charge pump unit in the output stage includes three charge pump units.

12. A method for providing power to an insulated gate FET, comprising the steps of:
providing an oscillatory output;
generating an output voltage by boosting up an input voltage in response to said oscillatory output;
supplying the output voltage to the gate of the FET;
comparing the output voltage with a preset reference voltage; and
controlling the stopping/starting of said oscillatory output in accordance with the comparison of the output voltage with the preset reference voltage.

13. The method of claim 12, further comprising the step of generating a divided voltage from said output voltage.

14. The method of claim 13, further comprising the step of comparing said divided voltage to said preset reference voltage.

15. The method of claim 14, further comprising the step of controlling the stopping/starting of said oscillatory output in accordance with the comparison of said divided voltage with said preset reference voltage.

* * * * *